United States Patent
Frey et al.

(10) Patent No.: US 6,645,800 B2
(45) Date of Patent: Nov. 11, 2003

(54) METHOD FOR THE PRODUCTION OF A FIELD-EFFECT STRUCTURE

(75) Inventors: Wilhelm Frey, Palo Alto, CA (US); Franz Laermer, Weil Der Stadt (DE); Klaus Heyers, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/016,259

(22) Filed: Oct. 26, 2001

(65) Prior Publication Data

US 2003/0045040 A1 Mar. 6, 2003

(30) Foreign Application Priority Data

Oct. 26, 2000 (DE) .......................... 100 53 111

(51) Int. Cl.[7] .......................... H01L 21/8238
(52) U.S. Cl. .................. 438/200; 438/53; 438/257; 257/254; 257/417; 257/192
(58) Field of Search .............. 438/53, 257, 200; 257/254, 417, 192

(56) References Cited

U.S. PATENT DOCUMENTS 4,812,888 A * 3/1989 Blackburn ................ 257/254
4,873,871 A * 10/1989 Bai et al. ...................... 73/777
5,103,279 A * 4/1992 Gutteridge ................ 257/254

FOREIGN PATENT DOCUMENTS

DE    198 44 676 C1    8/2000

* cited by examiner

*Primary Examiner*—Dung A Le
(74) *Attorney, Agent, or Firm*—Kenyon & Kenyon

(57) ABSTRACT

In a method for the production of a field-effect structure and a field-effect structure, a movable gate structure is arranged above a gate region in a substrate between a drain and a source. The gate region is covered with a gate oxide. The movable gate structure is created from silicon-germanium and in an intermediate step of the production method is arranged on a germanium sacrificial layer on the gate oxide.

13 Claims, 2 Drawing Sheets

METHOD FOR THE PRODUCTION OF A FIELD-EFFECT STRUCTURE

FIELD OF THE INVENTION

The present invention relates to a method for the production of a field-effect structure and to a field-effect structure as set forth herein.

BACKGROUND INFORMATION

German Published Patent Application No. 198 44 676 describes a field-effect structure in which appropriately doped drain and source regions are provided in a silicon substrate. A gate region, which is covered with a gate oxide, is arranged between the drain region and the source region. Above the gate region, a gate structure, which is designed as a movable bar, is arranged. A current flow between the source and the drain of the field-effect structure varies as a function of the position of the gate structure.

SUMMARY

By contrast, the method for producing a field-effect structure and the field-effect structure, according to an example embodiment of the present invention, includes the advantage that the gate region may be produced in such a way that the field-effect structure's long-term stability is improved. In particular, impurities in the gate region, which result in non-reproducible long-term changes in the field-effect structure's electrical behavior, are avoided.

According to one example embodiment of the present invention, silicon and silicon oxide are suitable as the material for the substrate and for the gate oxide. The drain region and the source region may be created in a straightforward manner with a silicon substrate by implanting dopants. Etching of the germanium sacrificial layer may be accomplished via oxidizing agents in an aqueous solution and also by etching in the gas phase via a combination of oxidizing agents and halogens. To protect the gate oxide, a cover layer made of silicon may be provided so as to create hermetic packaging during the production process itself. This cover layer may then be closed off via a sealing layer.

DETAILED DESCRIPTION

Figure 1:
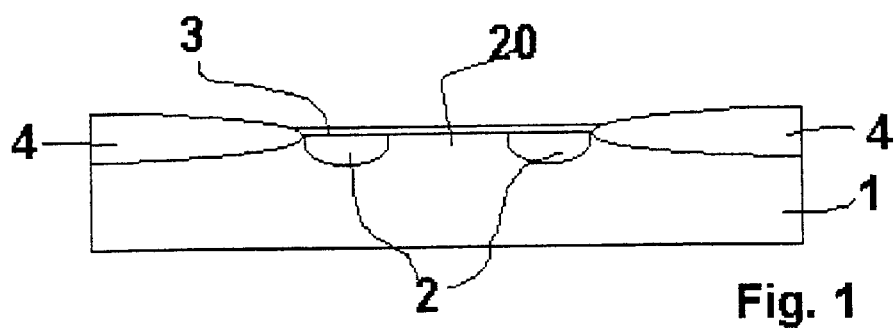
FIGS. 1 to 7 illustrate a production method for a field effect structure according to various example embodiments of the present invention, with FIG. 7 illustrating a completed field-effect structure according to one example embodiment of the present invention.

A production method for a field-effect structure is described below and in FIGS. 1 to 7 illustrating various steps in the process according to an example embodiment of the present invention.

FIGS. 1 to 7 illustrate a cross-section through a silicon substrate 1 according to one example embodiment of the present invention. Dopant zones 2 for a source and a drain of a field structure may be provided in the silicon substrate 1. For example, substrate 1 may be a p-doped silicon substrate in which n-dopants 2 which form the source and the drain are implanted. A gate region 20 is arranged between the drain and the source and may be formed from the p-material of silicon substrate 1. The drain and the source and the gate region 20 which is arranged between them may be covered by a gate oxide 3. Herein, this is a thin deposited layer of silicon oxide. The remainder of the surface of silicon substrate 1 may be covered with a thick oxide 4, which is the field oxide.

In the gate region 20, charge carriers which allow a current flow between the source and the drain may be created via an electrical field. Creation of the charge carriers in gate region 20 is largely dependent on the quality of gate oxide 3 that is above it. It only takes small changes or impurities in gate oxide 3 to cause significant changes in the creation of the charge carriers in gate region 20, so that it only takes slight fluctuations in the production process or changes in oxide layer 3 when the field-effect structure is in use to cause major fluctuations in the field-effect structure's properties. The method according to the present invention has the advantage that gate oxide 3 remains substantially unaffected by the rest of the production process, and therefore a gate oxide 3 that is especially reproducible and is stable in terms of its aging behavior over time may be created.

Figure 2:
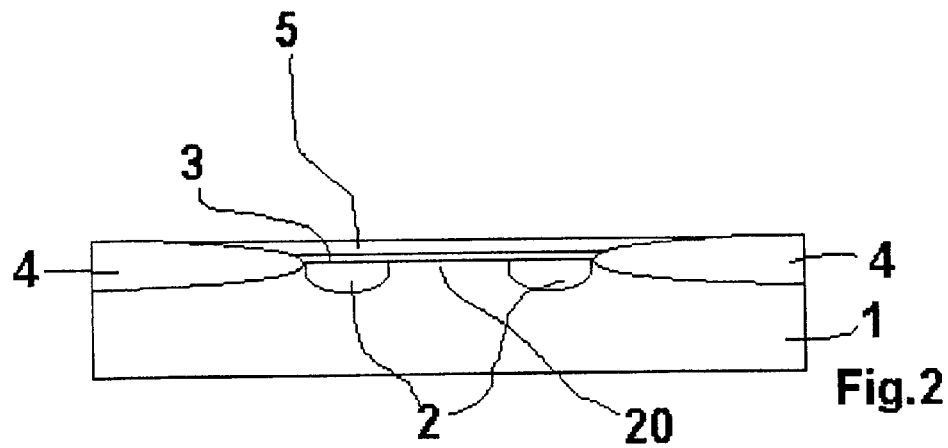
Figure 3:
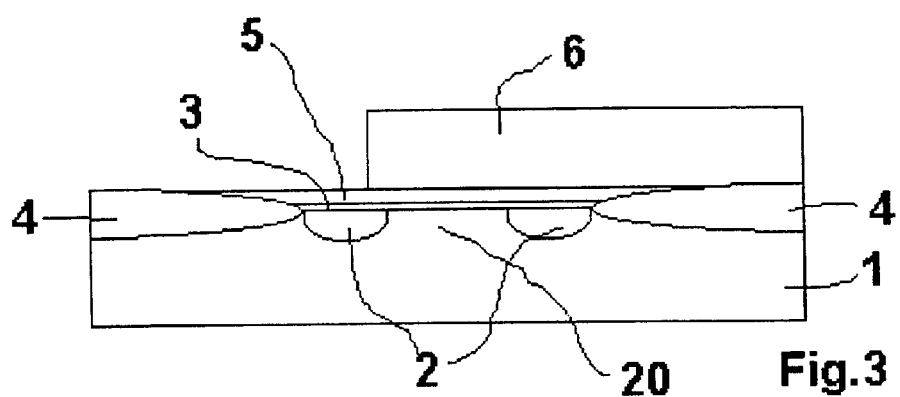
Figure 4:
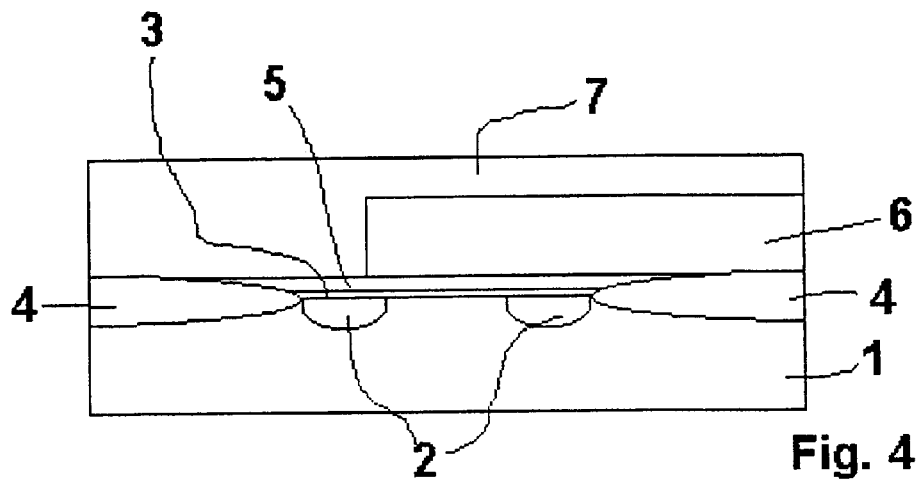

To accomplish this, a germanium layer 5 may be deposited on the surface of the silicon substrate illustrated in FIG. 1 in the region of gate oxide 3. This state is illustrated in FIG. 2. Below germanium layer 5 is referred to as the sacrificial layer.

After this, a relatively thick silicon-germanium layer 6 may be deposited and structured. The silicon-germanium layer 6 may be structured so that it forms a movable structure provided the underlying sacrificial layer 5 is removed. For example, the movable structure may be immovably attached to field oxide layer 4 and, in the region of sacrificial layer 5, it is thin enough that it may be moved relative to substrate 1 once the underlying sacrificial layer 5 has been removed.

Figure 5:
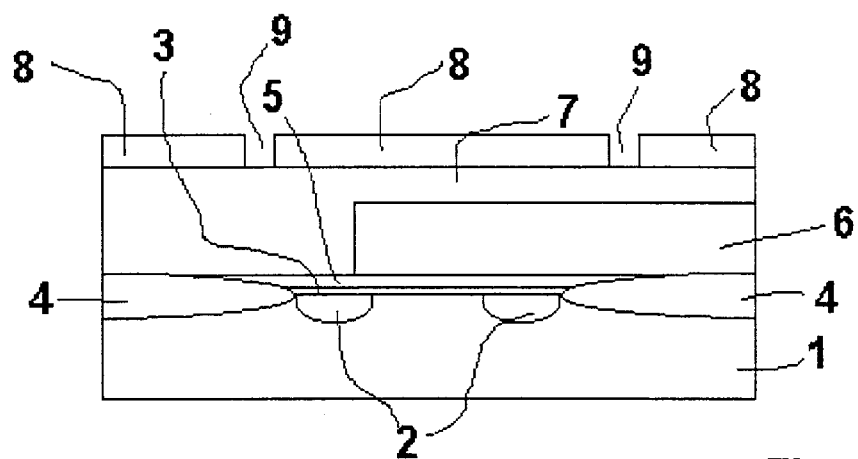
Figure 6:
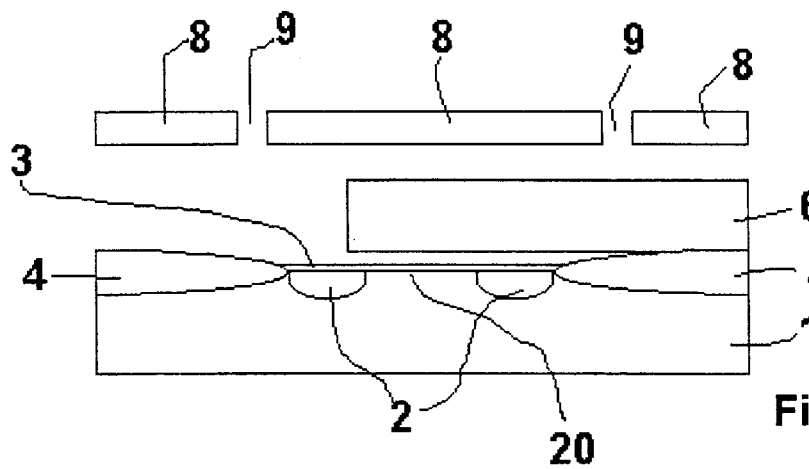

Next, in a further step, an additional germanium layer 7 may be deposited which may cover the entire surface of silicon substrate 1, and which may also cover the silicon-germanium layer 6. The surface may then be planarized via CMP (chemical mechanical polishing) in which mechanical removal/grinding of the surface is performed in conjunction with the use of chemical components (e.g., diluted KOH for Si) so that once again a smooth, uniform surface is available. This is illustrated in cross-section in FIG. 4. A cover layer 8, which may be made of silicon, may then be deposited on the layer that has been planarized as discussed. Etch openings 9 may then be created in this silicon cover layer 8. This state is illustrated in FIG. 5.

Next, an etching step may be performed in which the additional germanium layer 7 and sacrificial layer 5, which is also made of germanium, are etched through the etch openings 9. This may result in the state illustrated in cross-section in FIG. 6. Cover layer 8 may be connected to substrate 1 or field oxide 4 in regions that are not illustrated in FIG. 6 so that this layer maintains itself at a distance from the silicon-germanium layer 6. Thus, the structure created from silicon-germanium layer 6 may be at a distance not only from the surface of gate oxide 3 but also from cover layer 8.

In a further process step, sealing layer 10 may now be deposited so that etch openings 9 are hermetically sealed off. This may create hermetically sealed packaging for the field-effect structure. This state is illustrated in FIG. 7.

Figure 7:
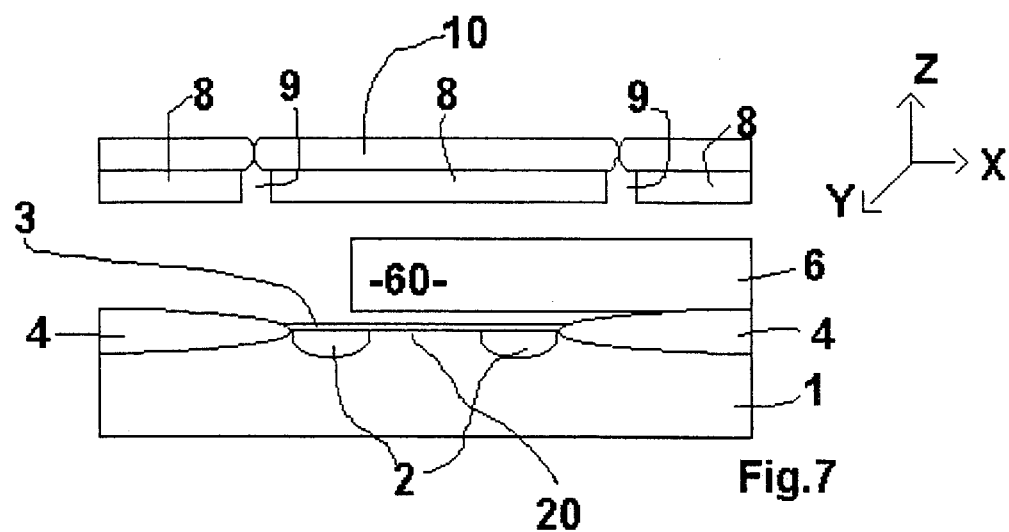

FIG. 7 illustrates a cross-section of a field-effect structure that has been created via the process sequence indicated in FIGS. 1 to 7 as discussed above according to one example embodiment of the present invention. A movable gate structure 60 has been created from the silicon-germanium layer 6. This movable gate structure 60 may be structured so that it is a bar structure that is longitudinal in the x-direction. Depending on the arrangement, the gate structure 60 that has been created in this manner is movable either in the z-direction or the y-direction. If an electrical potential is applied to this gate structure 60, the electrical field in gate region 20 between the drain and the source is affected if there is a change, for example, in the separation distance in the z-direction. Thus, the electrical field between drain and source 2 may be influenced by moving gate structure 60, and, if corresponding electrical voltages are applied to drain and source 2, this results in a change in the current flow. The movement of gate structure 60 may be determined by measuring the current flow between the drain and the source.

Due to the process sequence described above, an particularly high-quality gate oxide 3 may be guaranteed. This may be accomplished because processes that involve only relatively low temperatures may be used not only for depositing the germanium layers but also for depositing the silicon-germanium layer. Furthermore, germanium may be etched via etching processes which substantially have no impact on gate oxide 3 and also do not lead to contamination. Furthermore, the method according to the present invention allows particularly simple packaging to be created using, for example, cover layer 8 and sealing layer 10. Hermetically sealed packaging may therefore be achieved. This packaging may ensure good protection for gate oxide 3 when the sensor is in use, and may also ensure good protection in the process step that follows directly after exposure of the gate oxide, thereby helping to minimize in-process damage.

Wet-chemical processes as well as gas processes may be used to etch the germanium. A particularly straightforward process involves wet-chemical etching using $H_2O_2$ via which water-soluble germanium oxide is formed. The disadvantage of this type of etching is that an aqueous solution is used, which means powerful capillary action arises during drying.

Therefore, gas-etching may be employed via an oxidizing agent and a halogen. Etching the germanium in a gas phase that contains $H_2O_2$ only is not feasible, because no volatile product is formed. The germanium oxides formed in $H_2O_2$ are water soluble, but at moderate temperatures they cannot be converted into the gas phase. According to one example embodiment of the present invention, the remedy is to employ a gas-phase process involving an oxidizing agent in conjunction with a vaporizer, i.e., a reactant that may react with germanium to form a volatile end product. To accomplish this, a mixture of a gaseous oxidizing agent, e.g., ozone, may be used in conjunction with a halogen, e.g., chlorine, which may be used either in the form of elementary chlorine or in the form of HCl gas. The presence of the ozone molecule ensures the oxidation of the germanium, and the presence of the chlorine or HCl ensures the conversion of the germanium oxide into a liquid chloride. Instead of chlorine or HCl another halogen or halogen compound may be used. It is simply necessary to ensure that there is sufficient selectivity with respect to the silicon surfaces that are simultaneously exposed above all with respect to functional silicon oxides. Thus, it may also be feasible to use HF. However, this has the disadvantage that a certain amount of silicon and, respectively, silicon oxides are removed. In instances where this is not tolerable, it is necessary to switch to the more weakly reactive halogens chlorine and bromine or, respectively, HCl or HBr, which do not spontaneously etch silicon even if ozone is simultaneously acting and, moreover, do not damage functional silicon oxides. This ensures that selective etching of the germanium occurs with silicon and silicon oxide surfaces remaining passive.

To obtain ozone, an ozonizer may be used in a conventional manner converting oxygen into ozone via a cold electrical discharge with the ozone and $Cl_2$/HCl or $Br_2$/HBr as reactive gas being conveyed to the etching device. Alternatively, oxygen or air may be conveyed along with the halogen or halogen compound(s) so that ozone is subsequently formed in situ in the etching device via UV irradiation. Even chlorine oxides or bromine oxide may be formed in situ (see below). These short-lived, highly reactive compounds are produced from oxygen or ozone and from the halogens or halogen compounds precisely at the point where they may subsequently react with the germanium, it therefore being unnecessary to generate or convey them in a costly manner.

According to an example embodiment of the present invention, the function of the oxidation carrier and of the halogen supplier is fulfilled by a single compound, e.g., in the form of chlorine oxides or bromine oxides. These compounds exist in a wide variety of forms, in the form of $Cl_xO_y$ or $Br_xO_y$. A typical representative of this class of substance is chlorine dioxide, $ClO_2$. Chlorine oxides and bromine oxides are all extremely unstable and reactive. This ensures that when they come into contact with the germanium, oxidation and halogenization occurs immediately and spontaneously.

One possible gas-phase etching process involving chlorine dioxide as a reactive gas is as follows:

$$Ge + 2ClO_2 \rightarrow GeCl_2 + 2O_2$$

Herein, the germanium is spontaneously etched, volatile $GeCl_2$ being formed via chlorine oxide.

As this compound/these compounds is/are very unstable, it/they may not be purchased in the form of gas bottles, etc. but rather must be produced on site and used directly for the above reaction. Because high concentrations of the gas are explosive, spontaneous decomposition being involved, it is very important to dilute it sufficiently using nitrogen, oxygen, another inert gas, or air. A reaction involving HCl and $H_2O_2$ may also be used, for example, to produce $ClO_2$ in addition to the method described above whereby it is obtained from oxygen or ozone and from the halogens or halogen compounds with the help of UV irradiation applied to the etching apparatus. The HCl and $H_2O_2$ are both considered CMOS-compatible substances. The reaction equation may read as follows:

$$2HCl + 5H_2O_2 \rightarrow 6H_2O + 2ClO_2$$

Another possible production method involves conversion of chlorates or perchlorates using concentrated sulfuric acid. For example, if sodium chlorate is used the reaction equation may read as follows:

$$2\ NaClO_3 + H_2SO_4 \rightarrow Na_2SO_4 + <H_2O> + Cl_2O_5 \leftarrow \rightarrow ClO_2 + ClO_3 + \ldots$$

<$H_2O$> means that this water bonds with sulfuric acid via the formation of a hydrate and is not present in its free form, which results in the release of chloric acid anhydride (dichloro-pentoxide), which supplies simpler chlorine oxides via disproportioning. This production method has the advantage that due to the hygroscopic effect of the concentrated sulfuric acid, especially dry anhydrous reactive gas made of chlorine oxides may be obtained. If production according to the first reaction equation is employed, the reactive gas may also be dried by passing the gas mixture through an desiccator, the desiccator also being filled with concentrated sulfuric acid.

The reactive gas may be dried, since the anhydrous compound is the only one which will not corrode aluminum contact surfaces that are simultaneously exposed. These metal contacts may be massively corroded by moisture in conjunction with the halogen compounds and thus destroyed. Therefore a dry, anhydrous chemical process may be preferable.

What is claimed is:

1. A method for producing a field-effect structure having a movable gate structure above a gate region, comprising the steps of:

provamiding a substrate having a drain, a source and the gate region arranged therebetween, the gate region being covered with a gate oxide;

creating a germanium sacrificial layer on the gate region;

creating a structure for the movable gate structure made of silicon-germanium on the sacrificial layer; and etching the sacrificial layer.

2. The method according to claim 1, wherein the substrate includes a silicon substrate and the gate oxide includes a silicon oxide.

3. The method according to claim 2, further comprising the step of creating the drain and the source via doping in the silicon substrate.

4. The method according to claim 1, wherein the etching step is performed with an aqueous solution of an oxidizing agent.

5. The method according to claim 4, wherein the oxidizing agent includes $H_2O_2$.

6. The method according to claim 1, wherein the etching step is performed in a gas phase of an oxidizing agent and of a halogen.

7. The method according to claim 6, wherein the oxidizing agent includes ozone.

8. The method according to claim 1, wherein the etching step is performed in a gas phase that includes a halogen oxide.

9. The method according to claim 8, wherein the halogen oxide includes $ClO_2$.

10. The method according to claim 8, further comprising the step of conveying the halogen oxide from a chemical conversion reaction to an etching apparatus.

11. The method according to claim 8, further comprising the step of generating the halogen oxide in situ by UV irradiation from one of oxygen and ozone and one of the halogens and halogen compounds.

12. The method according to claim 1, further comprising the steps of:

applying and planarizing an additional germanium layer before the etching step;

applying a cover layer made of silicon after the applying and planarizing step; and creating etch openings in the cover layer;

wherein the etching step includes the substep of etching the sacrificial layer and the additional germanium layer through the created etch openings.

13. The method according to claim 12, further comprising the step of closing off the etch openings via a sealing layer after the etching step.

* * * * *